(12) United States Patent
Marinet

(10) Patent No.: US 8,330,158 B2
(45) Date of Patent: Dec. 11, 2012

(54) GENERATING AN INTEGRATED CIRCUIT IDENTIFIER

(75) Inventor: Fabrice Marinet, Chateauneuf le Rouge (FR)

(73) Assignee: STMicroelectronics S.A., Montrouge (FR)

( * ) Notice: Subject to any disclaimer, the term of this patent is extended or adjusted under 35 U.S.C. 154(b) by 65 days.

(21) Appl. No.: 12/949,314

(22) Filed: Nov. 18, 2010

(65) Prior Publication Data

US 2011/0062601 A1    Mar. 17, 2011

Related U.S. Application Data

(62) Division of application No. 11/663,219, filed as application No. PCT/FR2005/050772 on Sep. 23, 2005, now Pat. No. 7,871,832.

(30) Foreign Application Priority Data

Sep. 23, 2004 (FR) ..................................... 04 52140

(51) Int. Cl.
*H01L 23/58* (2006.01)

(52) U.S. Cl. ................... 257/46; 257/922; 257/E21.523

(58) Field of Classification Search .......... 257/750–767, 257/48, 922, E21.523
See application file for complete search history.

(56) References Cited

U.S. PATENT DOCUMENTS

| | | | |
|---|---|---|---|
| 5,155,378 | A | 10/1992 | Takagi et al. |
| 5,222,043 | A | 6/1993 | Pribyl et al. |
| 5,894,172 | A | 4/1999 | Hyozo et al. |
| 2001/0042901 | A1 | 11/2001 | Maruyama |
| 2002/0149120 | A1 | 10/2002 | Sugiyama |
| 2004/0169275 | A1 | 9/2004 | Danvir et al. |

FOREIGN PATENT DOCUMENTS

| | | |
|---|---|---|
| EP | 0133955 | 3/1985 |
| EP | 0962979 | 12/1999 |
| JP | 58003256 | 1/1983 |
| JP | 63239863 | 10/1988 |
| WO | WO 9724763 | 7/1997 |

OTHER PUBLICATIONS

International Search Report from corresponding International Application No. PCT/FR2005/050772, filed Sep. 23, 2005.

*Primary Examiner* — H. Jey Tsai
(74) *Attorney, Agent, or Firm* — Wolf, Greenfield & Sacks, P.C.

(57) ABSTRACT

The generation of a chip identifier supporting at least one integrated circuit, which includes providing a cutout of at least one conductive path by cutting the chip, the position of the cutting line relative to the chip conditioning the identifier.

19 Claims, 3 Drawing Sheets

GENERATING AN INTEGRATED CIRCUIT IDENTIFIER

CROSS REFERENCE TO RELATED APPLICATIONS

This application is a division of prior U.S. application Ser. No. 11/663,219, filed on Aug. 15, 2007, entitled "Generating An Integrated Circuit Identifier" which application is a national stage of International Application No. PCT/FR2005/050772, filed on Sep. 23, 2005 which application claims the priority benefit of French Patent Application No. 04/52140, filed on Sep. 23, 2004, which applications are hereby incorporated by reference to the maximum extent allowable by law.

BACKGROUND OF THE INVENTION

1. Field of the Invention

The present invention generally relates to the identification of integrated circuit chips by means of a number which differentiates one chip from another.

The present invention more specifically relates to a non-deterministic determination of an identifier (identification number if digital), that is, an unknown generation by the generator.

2. Discussion of the Related Art

Known methods for generating in non-deterministic fashion an identifier of an integrated circuit chip generally use a network for generating a binary word sensitive to physical parameters, for example, sensitive to technological dispersions, to generate a dispersed identifier for the chip. Dispersed means an identifier which has a non-zero probability of being reproduced for another chip. This probability must be in accordance with the requirements of the application and is variable from one application to another.

In the generation of a non-deterministic identifier, it is desired for the generation to be pseudo-random and thus not to be predetermined.

The manufacturing of the network sensitive to the physical parameters often requires a specific step on manufacturing to create this network.

SUMMARY OF THE INVENTION

The present invention aims at providing a method for generating an identification number of an integrated circuit chip on manufacturing thereof.

The present invention also aims at providing a non-deterministic generation, that is, the result of which is unknown before the generation.

The present invention also aims at providing a solution which is particularly simple to exploit in terms of reading of the generated number.

The present invention also aims at providing a non-volatile storage of the generated identifier with no use of active storage elements.

The present invention more specifically aims at enabling the generation with no specific dedicated step.

To achieve these and other objects, the present invention provides a method for generating an identifier of a chip supporting at least one integrated circuit, comprising causing a cutting of at least one conductive path by cutting of the chip, the position of the cutting line with respect to the chip edge conditioning the identifier.

According to an embodiment of the present invention, the identifier of the chip is a function of the resistance remaining in the conductive path after cutting.

According to an embodiment of the present invention, a conductive surface having respective ends connected to a circuit for reading the identifier which is a function of the resistance of said surface is formed at the periphery of at least one edge of the chip.

According to an embodiment of the present invention, from at least one of the edges of the chip, several conductive sections, geographically parallel to this edge and electrically connected in parallel to two terminals of the chip connected to a circuit for reading the identifier which is a function of the number of sections remaining after cutting, are formed.

According to an embodiment of the present invention, at least several first conductive sections parallel to one another and perpendicular to at least one edge of the chip are individually connected, by at least one of their ends, to the chip, the different sections exhibiting different lengths.

According to an embodiment of the present invention, the minimum interval between two first sections is smaller than the positioning tolerances of the cutting with respect to the chip.

According to an embodiment of the present invention, the first conductive sections are interconnected in the chip to a terminal of application of an excitation signal on a first one of their ends, their second respective ends providing bits of the identification number.

According to an embodiment of the present invention, the first conductive sections are connected to one another successively by secondary perpendicular sections, the lengths of the different first sections increasing from a first end of application of an excitation signal.

According to an embodiment of the present invention, the conductive path(s) are formed in at least one buried layer.

According to an embodiment of the present invention, the conductive path(s) are formed in at least one metallization level.

The present invention also provides an integrated circuit chip comprising, on at least one side, at least one conductive path having two end terminals connected to the inside of the chip to generate an identifier thereof which depends on the position of a cutting line with respect to the corresponding edge of the chip.

According to an embodiment of the present invention, the chip comprises a circuit of excitation of the conductive path at one of its ends and of reading of the voltage at its other end.

The foregoing objects, features, and advantages of the present invention will be discussed in detail in the following non-limiting description of specific embodiments in connection with the accompanying drawings.

DETAILED DESCRIPTION

Figure 1:
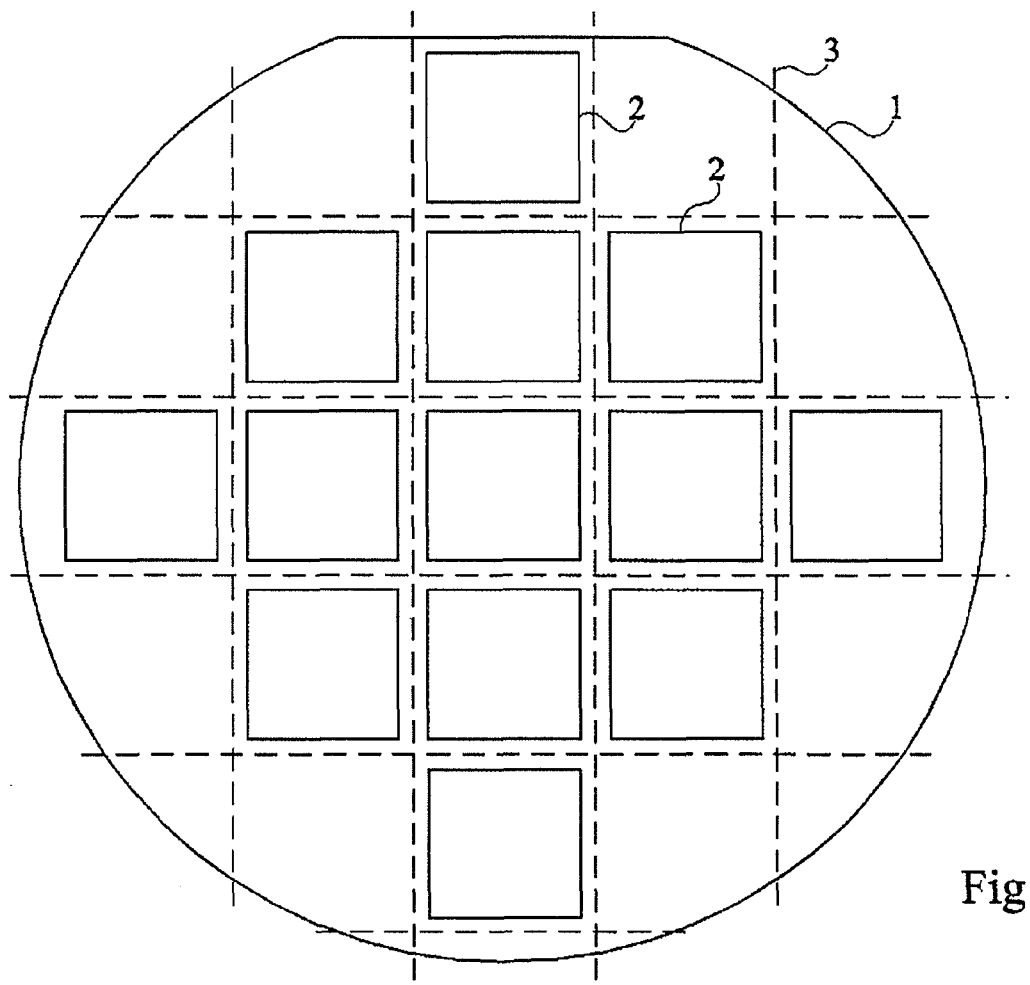
FIG. 1 is a simplified top view of a wafer on which integrated circuits have been manufactured.

The same elements have been designated with the same reference numerals in the different drawings which have been drawn out of scale. For clarity, only those elements that are useful to the understanding of the present invention have been shown in the drawings and will be described hereafter. In particular, the exploitation made by the integrated circuit of the identifier, be it in recognition, ciphering, or other applications, has not been described in detail. The present invention is compatible with any conventional exploitation of an identifier stored in an integrated circuit chip.

A feature of the present invention is to generate an identifier of an integrated circuit chip on individualization thereof with respect to the other chips with which it is manufactured on an integrated circuit wafer.

FIG. 1 is a simplified top view of an integrated circuit wafer 1 on which have been formed several circuits or chips 2. Arbitrarily, the circuits have in FIG. 1 been shown as being square but any other integrated circuit shape is appropriate for the present invention. Further, it is assumed that identical circuits are formed on wafer 1, but the present invention also applies to the case where different chips are formed on the same wafer, provided that the cutting paths are respected as will be shown hereafter. Further, reference will be made to an integrated circuit chip, knowing that each chip may comprise one or several active and/or passive circuits.

At the end of the manufacturing, integrated circuit chips 2 are individualized by being cut (for example, by means of a saw) in paths 3 between chips 2. The present invention will be described hereafter in relation with a cutting with a saw, but is more generally compatible with any conventional integrated circuit cutting method.

A feature of the present invention is to provide, between chips, that is, in the cutting paths, at least one electrically conductive path that can be interrupted on cutting.

Figure 2:
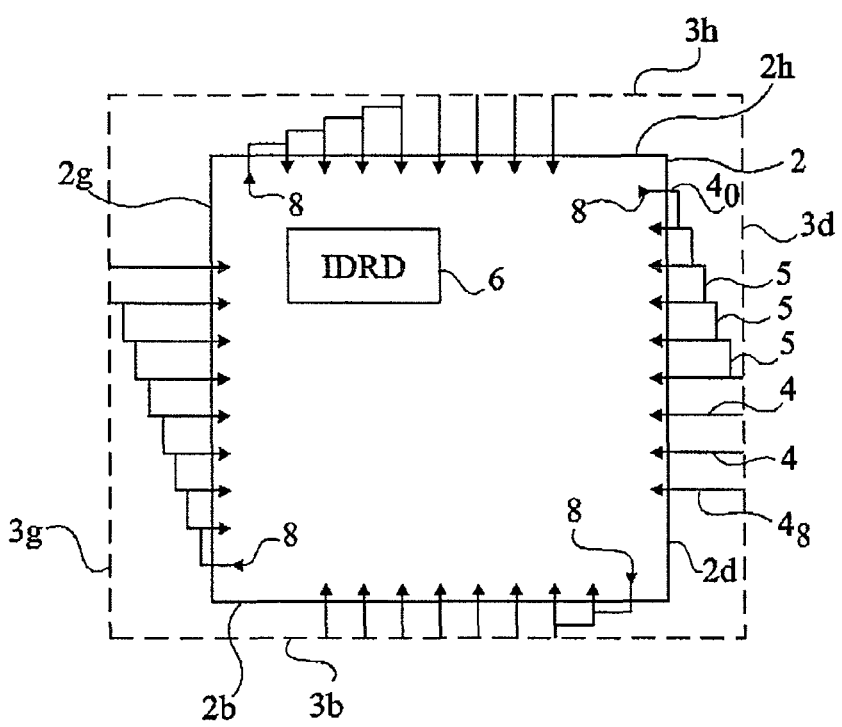
FIG. 2 is a detailed view of an integrated circuit chip of FIG. 1 showing means for generating and storing an identification number according to a first embodiment of the present invention.

FIG. 2 shows, in a very simplified top view, an integrated circuit chip 2 according to a first preferred embodiment of the present invention.

In this example, on manufacturing of integrated circuits 2 and in the cutting paths, several parallel conductive sections 4, perpendicular to edge 2g, 2h, 2d, or 2b of chip 2 to which they are respectively connected, are formed. Electric sections 4 of a same edge are further connected, at least by groups, successively to one another by means of conductive sections 5, perpendicular to sections 4.

According to the present invention, the respective positions of connection sections 5 with respect to the edge of the chip to which the corresponding sections 4 are connected are at different distances (increasing from a first section $4_0$ to a last section $4_8$).

In the integrated circuit chip cutting, the cutting line 3g, 3h, 3d, or 3b parallel to the concerned edge 2g, 2h, 2d, or 2b interrupts several sections 4 and, accordingly, suppresses one or several connections 5 to the sections of greater lengths.

This results in that, according to the position of cutting line 3 with respect to the chip edge, the number of conductive sections connected to one another by a perpendicular section 5 is different. It is then enough to excite, for example, by means of a D.C. voltage provided by a circuit 6 (IDRD) comprised in chip 2, end 8 of the shortest section $4_0$ and to measure the respective voltages at the ends of all the other sections of the same edge to obtain, directly in binary fashion, a word (here, over 8 bits) constitutive of the integrated circuit chip identifier. Chip 2 comprises means for exploiting (measuring and interpreting) the identifier, for example, contained in circuit 6.

Preferably, the same structure is reproduced on at least two sides, preferably on the four sides or more in the case of a non-parallelepipedal chip. The obtained digital words are concatenated (as an alternative, combined). The reproduction of a same identification number is made less probable for the same integrated circuit wafer since, if two chips have the same number by one of the edges because they have been submitted to the same cutting line, there is little chance for them to have the same cutting line on two perpendicular edges.

The elements provided on the different sides do not necessarily comprise the same number of sections (and thus of bits).

The positioning tolerances of cutting lines 3 in the paths on a wafer 1 are thus taken advantage of by the present invention to individualize the chip identifiers with respect to one another. The only precaution is that the length intervals between the different paths be compatible with the width of the cutting line (for example of the saw) and its positioning tolerances. In practice, this amounts to preferentially providing a minimum interval between sections 5, towards sections 4, smaller than the positioning tolerances of the cutting with respect to the chip edges. This condition enables guaranteeing the non-deterministic character of the identifier generation.

As a specific example, the most currently-used saws are designed for cutting paths (interval between two chips 2 of a same wafer 1) on the order of 100 µm and the cutting line (corresponding to the width of the saw) has a thickness on the order of from 20 to 25 µm. The tolerances in the saw alignment are on the order of 5 µm, which leaves a 10-µm range to differentiate the lengths of the conductive sections.

The number of conductive paths generating and storing the identification numbers depends on the application and on the chip size. The respective minimum lengths of the buried conductive depositions or of the metallization levels formed in integrated circuits with respect to the chip sizes allow generation of identifiers over a large number of bits (several hundreds, if need be).

Conductive sections may be formed in buried layers (active layers) or in upper metallization levels (interconnection levels). An advantage of buried layers is that they avoid the occurrence of splinters in the cutting as is the case for metal levels.

It should be noted that, although a saw cutting line generally causes a scaling at the front surface of the chip, this scaling is not disturbing. It only adds a random element in the interruption of the cutting paths.

In the example of FIG. 2, assuming that the presence of a voltage is read as a state 1, side 2d of the chip provides a digital value 11111000. Side 2h of the chip provides a value 11110000. Left side 2g provides a value 11111110. Low side 2b provides a value 11000000.

Figure 3A:
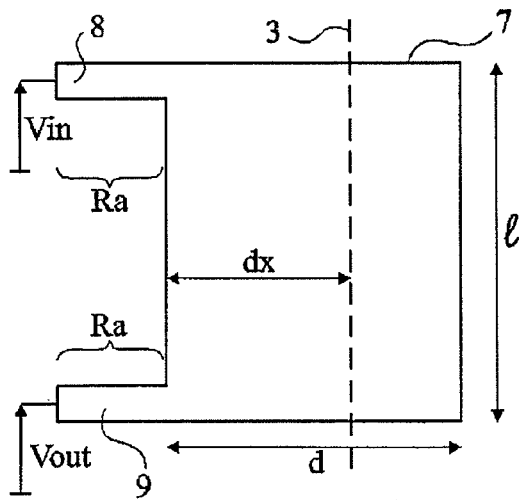
FIGS. 3A and 3B illustrate a second embodiment of the method for generating an identification number according to the present invention.

FIG. 3A shows a top view of an element for generating and storing an identifier of a chip 2 according to a second embodiment of the present invention. In this example, element 7 is an analog generation and storage element, conversely to the first embodiment which enables a readily digital generation.

In FIG. 3A, a surface (for example, rectangular) is provided at the border of the chip (not shown) so that this surface is likely to be cut by a cutting line 3. After the cutting, width dx of the remaining conductive track is smaller than its initial width d. Its length l between two input-output terminals 8 and 9 however remains constant.

Figure 3B:
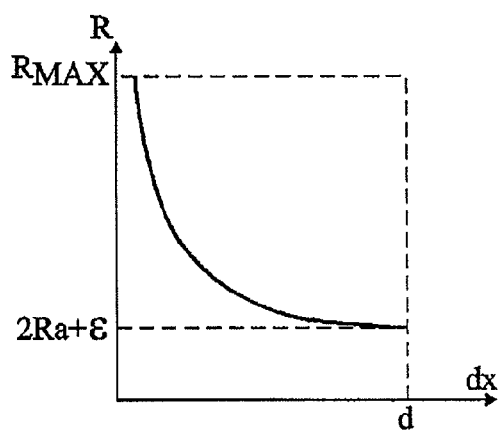

In this embodiment, the cutting results in modifying the resistance of identification element 7. FIG. 3B very schematically illustrates the variation of resistance R of element 7 of FIG. 3A according to width dx remaining after the cutting. This variation has the shape of a hyperbola from a width dx=d corresponding to 2Ra+ϵ (ϵ representing the minimum resistance of surface area d*l of element 7 and 2Ra representing the sum of the two access resistances Ra of sections 8 and 9 up to surface 7), and decreases to a maximum value Rmax for a minimum width dx.

By applying to one of the accesses (for example, 8) a D.C. voltage Vin, the voltage level Vout which is recovered for a current I on the other access 9 depends on the resistance of element 7, and thus on the position of the cutting line across its width.

The identifier is then either directly exploited in analog fashion or converted into a digital signal by means of an analog-to-digital converter.

Figure 4:
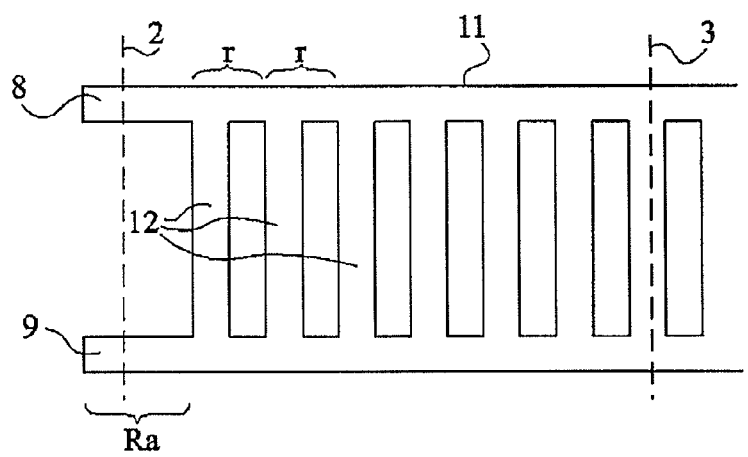
FIG. 4 shows an element for storing an identification number according to a third embodiment of the present invention.

FIG. 4 shows a third embodiment according to the present invention. In this embodiment, element 11 for generating and memorizing an identifier is formed of several conductive sections 12 parallel to one another and at the edge of chip 2 (more specifically parallel to cutting line 3). As in the previous embodiment, element 11 exhibits two accesses 8 and 9 respectively of excitation and reading. Parallel sections 12 are all electrically connected in parallel and accordingly define a parallel association of several individual resistors r. According to the position of cutting line 3, the general resistance of element 11 varies. Its value is equal to 2Ra+r/n, where 2Ra represents the sum of resistances Ra of access to element 11 from terminals 8 and 9, and where n designates the number of sections 12 remaining in parallel after the cutting.

The exploitation of the analog value provided by element 11 is performed in the same way as for the second embodiment of FIG. 3.

Figure 5:
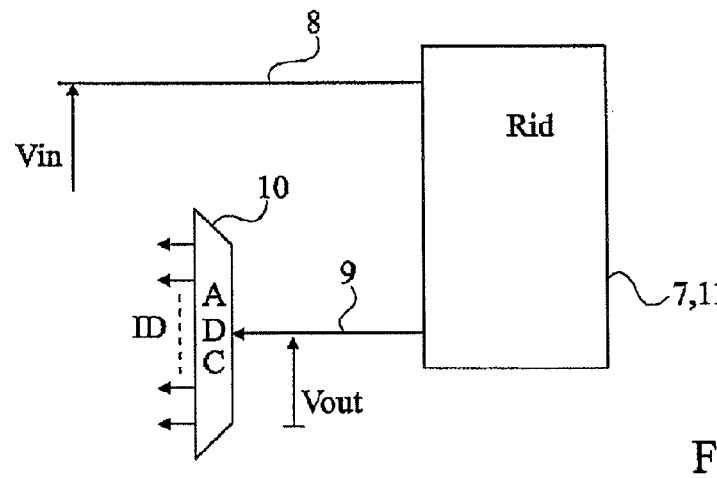
FIG. 5 very schematically shows in the form of blocks an embodiment of a circuit for exploiting a deterministic number generated by the second and third embodiments.

FIG. 5 very schematically shows, in the form of blocks, an example of a circuit for reading the identifier of an integrated circuit chip generated by the embodiment of FIG. 3A or of FIG. 4. A voltage Vin is applied on a terminal 8 while voltage Vout read from the other end terminal 9 of element 7 or 11 is applied to the input of an analog-to-digital converter 10 having its outputs providing a binary word representing identifier ID of the integrated circuit. The sensitivity of the analog-to-digital converter is selected according to the tolerance in the position of the cutting with respect to the chip edge to obtain identifiers which are different according to the integrated circuits. In the case where several elements are distributed around the chip (be it on different sides or not), it is provided either to sum up the analog contributions, or more simply to concatenate (as an alternative, to combine) the digital values obtained for the different elements.

In an analog generation, the non-deterministic criterion is intrinsic in the case of an analog exploitation (it depends on the sensitivity of the detector interpreting the analog values) and, in the case of a digital exploitation, depends on the sensitivity of the analog-to-digital converter.

Figure 6:
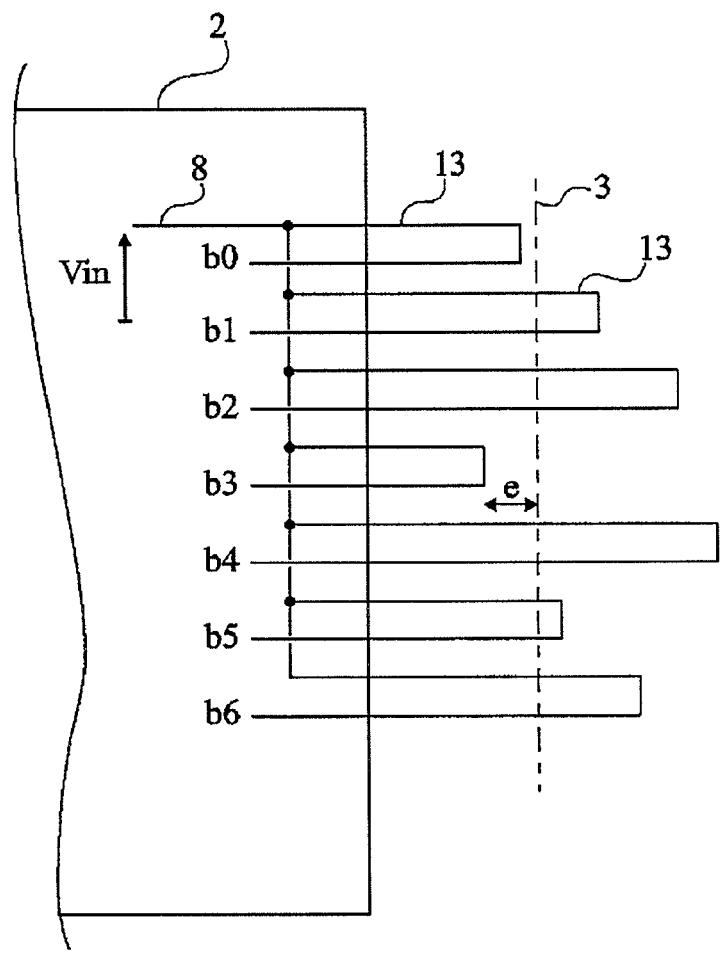
FIG. 6 is a partial top view of an integrated circuit chip illustrating a fourth embodiment of a generation of an integrated circuit chip identification number according to the present invention.

FIG. 6 shows a fourth embodiment of the present invention in which individual paths 13 are connected in parallel to a terminal 8 of application of an input voltage Vin, their other respective ends being individually readable by the read circuit (6, FIG. 2) comprised in chip 2 and directly providing states zero or a component of the bits (in this example, b0 to b6) of the identification number.

Since sections 13 are individualized, it is not required for them, as in the first embodiment, to be of increasing length. In the embodiment of FIG. 6, the position of cutting line 3 interrupts some of the conductive sections which then provide first binary states (for example, zero) while the uninterrupted sections provide complementary states (for example, 1).

With this convention, the seven bits of the identification element of FIG. 6 provide value 1001000.

Figure 7:
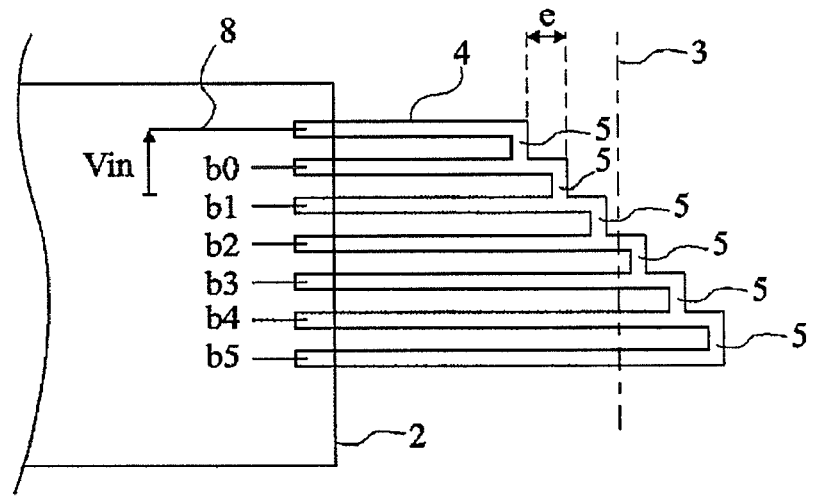
FIG. 7 illustrates in more detailed fashion a storing element according to the first embodiment of the present invention.

FIG. 7 shows an enlarged view of conductive sections 4 of the first embodiment of FIG. 2, assuming that the element provides 5 bits b0 to b5. Conversely to the embodiment of FIG. 6, the cutting line does not individually condition the states but sets the rank of the word bit from which the state switches. In FIG. 7, a width of conductive sections 4 and 5 has been illustrated.

In this example, the five bits of the formed identification element provide value 111000.

An advantage of the present invention is that it enables generating, in an extremely simple fashion, identification numbers of integrated circuit chips.

Another advantage of the present invention is that the storage of the identification number, generated at the end of the manufacturing by the chip cutting, is intrinsic to the chip and requires no active element. This number may however also be stored in the chip.

Another advantage of the present invention is that the generation requires no dedicated manufacturing step, the forming of the conductive paths occurring at the same time as the chip connections in its conductive levels and the generation and the storage of the identifier being performed at the same time as the chip cutting.

Another advantage of the present invention is that the identifier reading is particularly simple (simple comparators are sufficient in the digital embodiments).

The generation and storage elements are not necessarily distributed over all the chip sides. They may be located on a portion of each edge of the cut chips.

The implementation of the present invention is compatible with the packaging subsequent to the cutting of an integrated circuit chip, with no specific precaution.

As an alternative, different paths may be provided in several conductive levels. An additional differentiation may then result from the cutting angle of the cutting tool if the angular tolerances are compatible.

Of course, the present invention is likely to have various alterations, modifications, and improvements which will readily occur to those skilled in the art. In particular, the adaptation of the dimensions to be given to the conductive path(s) of generation of the identification number according to the chip sizes and to the tolerances of the used cutting tools is within the abilities of those skilled in the art based on the functional indications given hereabove. Further, although the present invention has been described in relation with conductive sections parallel and/or perpendicular to the chip edges to be parallel and/or perpendicular to the cutting lines, slantwise sections may be provided, provided that this slanting is compatible with a differentiation between several chips after the cutting. Moreover, the practical forming of a circuit 6 for exploiting the identification elements of the present invention by electric excitation and reading of the results uses conventional electronic components and is within the abilities of those skilled in the art according to the application.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit chip comprising, on at least one side, at least one conductive path having two end terminals connected to a circuit in the chip to generate an identifier thereof which depends on the position of a cutting line with respect to the corresponding edge of the chip, wherein the at least one conductive path is configured to generate the identifier of the integrated circuit chip in a non-deterministic manner upon individualization of the integrated circuit chip by cutting along the cutting line.

2. The chip of claim 1, comprising a circuit of excitation of the conductive path at one of its ends and of reading of the voltage at its other end.

3. The chip of claim 1, wherein a value of the identifier is a function of a resistance of the conductive path after cutting.

4. The chip of claim 1, wherein the two end terminals of the conductive path are connected to the circuit.

5. The chip of claim 3, wherein the conductive path includes several conductive sections electrically connected in parallel and connected to the circuit.

6. The chip of claim 1, wherein the at least one conductive path includes several first conductive sections parallel to one another and perpendicular to at least one edge of the integrated circuit chip, the first conductive sections individually connected to the integrated circuit chip, and different conductive sections having different lengths.

7. The chip of claim 6, wherein the first conductive sections include first ends interconnected to a terminal of the integrated circuit chip for application of an excitation signal and second ends that provide bits of the identifier.

8. The chip of claim 6, wherein the first conductive sections are connected to one another by second conductive sections, the first conductive sections having different lengths with respect to an edge of the integrated circuit chip.

9. The chip of claim 1, wherein the at least one conductive path is formed in at least one buried layer.

10. The chip of claim 1, wherein the at least one conductive path is formed in at least one metallization level.

11. An integrated circuit chip comprising:
at least one integrated circuit; and
at least one conductive structure connected to the integrated circuit and configured to generate an identifier of the integrated circuit chip in a non-deterministic manner upon separation of the integrated circuit chip from a wafer by cutting along a cutting line, a value of the identifier depending on a position of the cutting line relative to the at least one conductive structure.

12. An integrated circuit chip as defined in claim 11, wherein the value of the identifier is a function of a resistance of the conductive structure after cutting.

13. An integrated circuit chip as defined in claim 12, wherein the at least one conductive structure comprises a conductive element having several conductive sections electrically connected in parallel and connected to a circuit configured to read the identifier.

14. An integrated circuit chip as defined in claim 11, wherein the at least one conductive structure includes several first conductive sections parallel to one another and perpendicular to at least one edge of the integrated circuit chip, the first conductive sections individually connected to the integrated circuit, and different conductive sections having different lengths.

15. An integrated circuit chip as defined in claim 14, wherein the first conductive sections include first ends interconnected to a terminal of the integrated circuit chip for application of an excitation signal, and second ends that provide bits of the identifier.

16. An integrated circuit chip as defined in claim 14, wherein the first conductive sections are connected to one another by second conductive sections, the first conductive sections having different lengths with respect to an edge of the integrated circuit chip.

17. An integrated circuit chip as defined in claim 11, wherein the at least one conductive structure is formed in at least one buried layer.

18. An integrated circuit chip as defined in claim 11, wherein the at least one conductive structure is formed in at least one metallization level.

19. An integrated circuit wafer comprising:
several integrated circuit chips, each including an integrated circuit, on the wafer; and
at least one conductive structure connected to at least one of the integrated circuits and configured to generate an identifier of the integrated circuit chip in a non-deterministic manner upon separation of the integrated circuit chip from the wafer by cutting along a cutting line, a value of the identifier depending on a position of the cutting line relative to the conductive structure.

* * * * *